(12) United States Patent
Sharma et al.

(10) Patent No.: US 12,712,530 B2
(45) Date of Patent: Aug. 18, 2026

(54) CIRCUIT PRE-CHARGING

(71) Applicant: TEXAS INSTRUMENTS INCORPORATED, Dallas, TX (US)

(72) Inventors: Ketan Sharma, Bengaluru (IN); Ravikumar Pattipaka, Bangalore (IN); Vajeed Nimran, Bangalore (IN); Aravind Miriyala, Bangalore (IN); Shabbir Amjhera Wala, Bangalore (IN); Savyan Kanisserry, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/496,465

(22) Filed: Oct. 27, 2023

(65) Prior Publication Data

US 2024/0223164 A1 Jul. 4, 2024

(30) Foreign Application Priority Data

Jan. 3, 2023 (IN) ............................. 202341000235

(51) Int. Cl.

*H03K 3/02* (2006.01)
*H03K 3/021* (2006.01)
*H03K 3/3568* (2006.01)

(52) U.S. Cl.

CPC ........... *H03K 3/021* (2013.01); *H03K 3/3568* (2013.01)

(58) Field of Classification Search

CPC ............................. H03K 3/021; H03K 3/3568
See application file for complete search history.

(56) References Cited

U.S. PATENT DOCUMENTS 9,058,046 B1 * 6/2015 Pilo .......................... G11C 7/12
9,442,507 B2 * 9/2016 Ghisu ................ H03K 17/0822
2003/0169625 A1 * 9/2003 Hush .................... G11C 13/004 365/189.07
2009/0206676 A1 8/2009 Chu et al.

FOREIGN PATENT DOCUMENTS

WO 2011079883 A1 7/2011

OTHER PUBLICATIONS

International Search Report in corresponding PCT Application No. PCT/US2024/010164, mailed Jun. 19, 2024.

* cited by examiner

*Primary Examiner* — Daniel C Puentes
(74) *Attorney, Agent, or Firm* — Xianghui Huang; Frank D. Cimino

(57) ABSTRACT

In some examples, a pulser circuit is configured to provide a pulse signal in a first operational state, pre-charge components of the pulser circuit via a first signal path in a second operational state following the first operational state, wherein the first signal path includes first components having a first voltage tolerance and second components having a second voltage tolerance, the first voltage tolerance being less than the second voltage tolerance, and discharge a voltage of the pulser circuit to ground in a third operational state between the first operational state and the second operational state, and following the second operational state.

18 Claims, 6 Drawing Sheets

CIRCUIT PRE-CHARGING

CROSS-REFERENCE TO RELATED APPLICATIONS

The present application claims priority to India Provisional Patent Application No. 202341000235, which was filed Jan. 3, 2023, is titled "Drain Pre-Charging Technique To Obtain >40 dBc Low Swing HD2 Performance And Reducing T/R Switch Turn On Time In High Voltage Ultrasound Transmitter Device," and is hereby incorporated herein by reference in its entirety.

BACKGROUND

Various circuits include elements that charge over a finite amount of time. A duration of this finite amount of time can impose operational limitations on the circuits.

SUMMARY

In some examples, a circuit includes a first transistor having a control terminal and first and second terminals. The circuit also includes a first diode having an anode and a cathode, the anode of the first diode coupled to the second terminal of the first transistor. The circuit also includes a second diode having an anode and a cathode, the anode of the second diode coupled to the cathode of the first diode. The circuit also includes a second transistor having a control terminal and first and second terminals, the first terminal of the second transistor coupled to the cathode of the second diode. The circuit also includes a third diode having an anode and a cathode, the anode of the third diode coupled to the second terminal of the first transistor. The circuit also includes a first switch having first and second terminals, the first terminal of the first switch coupled to the cathode of the third diode. The circuit also includes a fourth diode having an anode and a cathode, the cathode of the fourth diode coupled to the first terminal of the second transistor. The circuit also includes a second switch having first and second terminals, the first terminal of the second switch coupled to the anode of the fourth diode.

In some examples, a circuit includes a first transistor having a control terminal and first and second terminals. The circuit also includes a first diode having an anode and a cathode, the anode of the first diode coupled to the second terminal of the first transistor. The circuit also includes a second diode having an anode and a cathode, the anode of the second diode coupled to the cathode of the first diode. The circuit also includes a second transistor having a control terminal and first and second terminals, the first terminal of the second transistor coupled to the cathode of the second diode. The circuit also includes a first switch having first and second terminals, the first terminal of the first switch coupled to the second terminal of the first transistor. The circuit also includes a second switch having first and second terminals, the first terminal of the second switch coupled to the second terminal of the first switch. The circuit also includes a third switch having first and second terminals, the first terminal of the third switch coupled to a ground terminal, and the second terminal of the third switch coupled to the second terminal of the second switch. The circuit also includes a fourth switch having first and second terminals, the first terminal of the fourth switch coupled to the second terminal of the second switch.

In some examples, a system includes an amplifier having an output. The system also includes a first switch having first and second terminals, the first terminal of the first switch coupled to the amplifier output. The system also includes a second switch having first and second terminals, the first terminal of the second switch coupled to the second terminal of the first switch, and the second terminal of the second switch coupled to a receiver circuit terminal. The system also includes a third switch having first and second terminals, the first terminal of the third switch coupled to the second terminal of the first switch, and the second terminal of the third switch coupled to a ground terminal. The system also includes a pulser circuit having an output coupled to the first terminal of the first switch. The pulser circuit is configured to provide a pulse signal in a first operational state. The pulser circuit is also configured to pre-charge components of the pulser circuit via a first signal path in a second operational state following the first operational state, wherein the first signal path includes first components having a first voltage tolerance and second components having a second voltage tolerance, the first voltage tolerance being less than the second voltage tolerance. The pulser circuit is also configured to discharge a voltage of the pulser circuit to ground in a third operational state between the first operational state and the second operational state, and following the second operational state.

DETAILED DESCRIPTION

Figure 1:
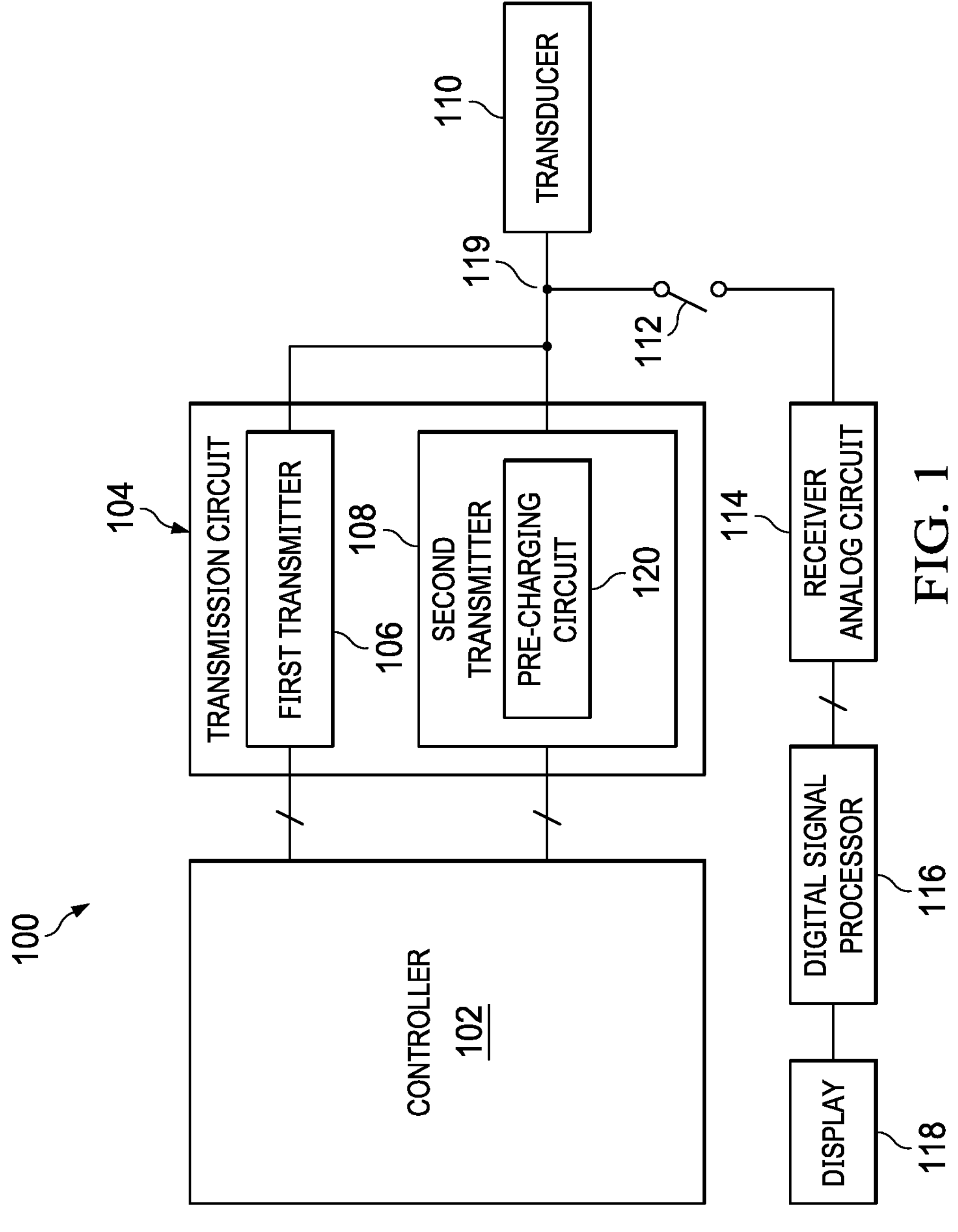
FIG. 1 is a block diagram of an example system.

As described above, various circuits include elements that charge over a finite amount of time. A duration of this finite amount of time can impose operational limitations on the circuits. For example, a charging time of a capacitor may inhibit a rapid response time for a circuit including that capacitor. Similarly, a reverse recovery charge time for a semiconductor device may inhibit a rapid response time for a circuit including that semiconductor device.

Some devices include a transmitter that includes multiple transmission paths. These transmission paths may be shorted together at an output of the transmitter to excite a transmission element. In some examples, the device may be an ultrasound imaging system and the transmission element is a transducer. In such an example, the transmitter may include a linear amplifier transmission path and a pulser transmission path, each of which is shorted to the other at an output of the transmitter. Receiver circuitry may also be coupled to the transducer, such as through a controllable switch.

In some examples, aspects of one transmission path may affect aspects of another transmission path. For example, components of one transmission path may draw current from a signal provided for transmission by the other transmission path. This may increase non-linearity of the signal and reduce the accuracy, or otherwise mitigate performance, or measurements performed based on the signal. Similarly, components of one or more of the transmission paths may include finite charge times, such as reverse recovery charge times. These charge times may impose operational limitations on a device, such as an ultrasound imaging system. For example, the charge times may limit a speed with which the ultrasound imaging system may transition from a transmit mode to a receive mode, thereby limiting imaging performance of the ultrasound imaging system (e.g., adversely affecting the performance or feasibility of near-surface imaging).

Examples of this description provide for circuit pre-charging. By pre-charging a circuit, such as one of the transmission paths described above, at least some challenges described above related to non-linearity of a transmission signal or effects of charge times may be mitigated. For example, by pre-charging a first transmission path (such as, in some examples, a pulser transmission path), linearity of a signal provided by a second transmission path (such as, in some examples, a linear amplifier transmission path) may be increased. By pre-charging the first transmission path, the first transmission path may draw less current from a signal provided by the second signal transmission path, thereby increasing linearity of the signal. For example, as a result of the pre-charging, less current may be drawn from the signal to charge components of the first transmission path than would be drawn in the absence of the pre-charging. Similarly, following a transmission via the first transmission path, components of the first transmission path may be charged, or pre-charged by causing a reverse current to flow through at least some components of the first transmission path. The pre-charging of the components of the first transmission path following a transmission by the first transmission path may reduce a reverse recovery charge time, or other charge time, of at least some components of the first transmission path. By reducing the reverse recovery charge time, a device, such as an ultrasound imaging system, that includes the circuit may transition between a transmit mode and a receive mode more quickly than in the absence of the pre-charging.

FIG. 1 is a block diagram of an example system 100. In some examples, the system 100 is representative of an ultrasound imaging system. The system 100 includes a controller 102, a transmission circuit 104 including a first transmitter 106 and a second transmitter 108, a transducer 110, a transmit/receive switch 112, a receiver analog circuit 114 (also referred to as an analog front end circuit), a digital signal processor (DSP) 116, and a display 118. The controller 102 may be any suitable controller, such as a processor, microprocessor, microcontroller, field-programmable gate array, (FPGA) or the like, the scope of which is not limited herein. In some examples, the DSP 116 may not be a discrete component, and may instead be implemented by the controller 102, or by a processor or other circuit that implements the controller 102, the DSP 116, and any other suitable components of the system 100. The first transmitter 106 and the second transmitter 108 are shorted at an output of the transmission circuit 104, e.g., at a node 119, and coupled to the transducer 110. In some examples, the transmission circuit 104 is implemented in a single integrated circuit (IC) package such that the first transmitter 106 and the second transmitter 108 are implemented on a same semiconductor die to form an IC.

In an example, the first transmitter 106 and the second transmitter 108 operate in separate voltage domains. The separate voltage domains may have at least some overlap in value ranges. In some examples, the first transmitter 106 includes, or is implemented as, an amplifier, such as a linear amplifier. As such, the first transmitter 106 may form an amplifier, or linear amplifier, transmission path through the transmission circuit 104. The first transmitter 106, in some application environments, operates in a voltage domain ranging from approximately +/−15 volts (V) to approximately +/−100 V. In some examples, the second transmitter 108 includes, or is implemented as, a pulser that provides a pulse signal, or multiple pulse signals, at a pulse repetition frequency. As such, the second transmitter 108 may form a pulser transmission path through the transmission circuit 104. The second transmitter 108, in some application environments, operates in a voltage domain ranging from approximately +/−2 V to approximately +/−100 V. In some examples, while the first transmitter 106 is transmitting, the second transmitter 108 is in a high-impedance state, and vice versa.

Responsive to a signal received from the transmission circuit 104, the transducer 110 produces sound waves, which are reflected back by surfaces within an object and detected, or received, by the transducer 110. For example, the object is a human body to which the transducer 110 is placed in contact and reflects the sound waves.

In an example, the transmit/receive switch 112 is in a first state (e.g., a transmit state) during a period of time in which the transmission circuit 104 provides the signal to the transducer 110 to excite the transducer 110 to produce the sound waves. Subsequent to providing the signal to the transducer 110, the transmit/receive switch 112 may be placed in a second state (e.g., a receive state) to enable the transducer 110 to provide a signal responsive to the reflected sound waves to the receiver analog circuit 114. In some examples, the controller 102 controls the transmit/receive switch 112 to be in the first state or the second state.

Responsive to the transmit/receive switch 112 being in the second state, the receiver analog circuit 114 receives a signal provided at the node 119. In some examples, the signal provided at the node 119 is the signal provided by the transducer 110 responsive to the reflected sound waves. In other examples, the signal provided at the node 119 is the signal provided by the transmission circuit 104 to the transducer 110 to excite the transducer 110 to produce the sound waves. In some examples, after providing the signal to the transducer 110, one or more components of the transmission circuit 104 have a reverse recovery time during which the components draw current until they are reverse biased. As such, a time between an end of the signal provided by the transmission circuit 104 to the transducer 110 and controlling the transmit/receive switch 112 to change from the first state to the second state may be limited by that reverse recovery time, as described above.

The receiver analog circuit 114 processes the signal according to any suitable analog signal processing, the scope of which is not limited herein. For example, the receiver analog circuit 114 may amplify the signal, may filter the signal, or may perform any other analog operation(s). Subsequent to any analog processing, the receiver analog signal 114 performs an analog to digital conversion of the processed signal to provide a digital value to the digital signal processor 116. The digital signal processor 116 receives the digital value and processes the digital value. The processing may be any suitable processing, the scope of which is not limited herein. In some examples, such as an ultrasound imaging system, the digital signal processor 116 processes the digital value for use in forming an image representative of a subject of a scan by the ultrasound imaging system. The digital signal processor 116 further provides data of this image to the display 118 for displaying by the display 118 to a user.

In some examples, the pulser (e.g., the second transmitter 108) includes one or more switches that selectively couple the node 119 to a voltage supply to provide a pulse signal to the transducer 110. The switches may have an inherent, or parasitic, capacitance that draws current non-linearly from the node 119. For example, while the second transmitter 108 is in a high-impedance state and the first transmitter 106 is transmitting (e.g., providing a signal to the transducer 110 to excite the transducer 110), the parasitic capacitance of the second transmitter 108 may draw current from the signal provided by the first transmitter 106. This current draw may decrease performance of the system 100.

As described above, by pre-charging components of the second transmitter 108, at least some of the above challenges related to parasitic capacitance induced current draw by the second transmitter 108 and time limitations imposed by a reverse recovery time of components of the second transmitter 108 may be mitigated. For example, the second transmitter 108 includes a pre-charging circuit 120 that pre-charges at least some components of the second transmitter 108 during transmission by the first transmitter 106, such as a terminal (e.g., a drain) of a transistor of the second transmitter 108. By pre-charging at least some components of the second transmitter 108 during transmission by the first transmitter 106, current draw by the second transmitter 108 from the node 119 during transmission by the first transmitter 106 is reduced. Similarly, subsequent to transmission by the second transmitter 108, the pre-charging circuit 120 pre-charges at least some components of the second transmitter 108. The pre-charging circuit 120 performs the pre-charging by increasing a reverse current flowing in the second transmitter 108 to decrease an amount of time consumed to reverse bias the components. The decreased amount of time to reverse bias enables control of the transmit/receive switch 112 to change from the first state to the second state more rapidly than in the absence of the pre-charging. The more rapid control of the transmit/receive switch 112 enables receipt of a signal provided by the transducer 110 responsive to reflected sound waves having less degradation than in examples in which more time elapses between transmission and receipt.

Figure 2:
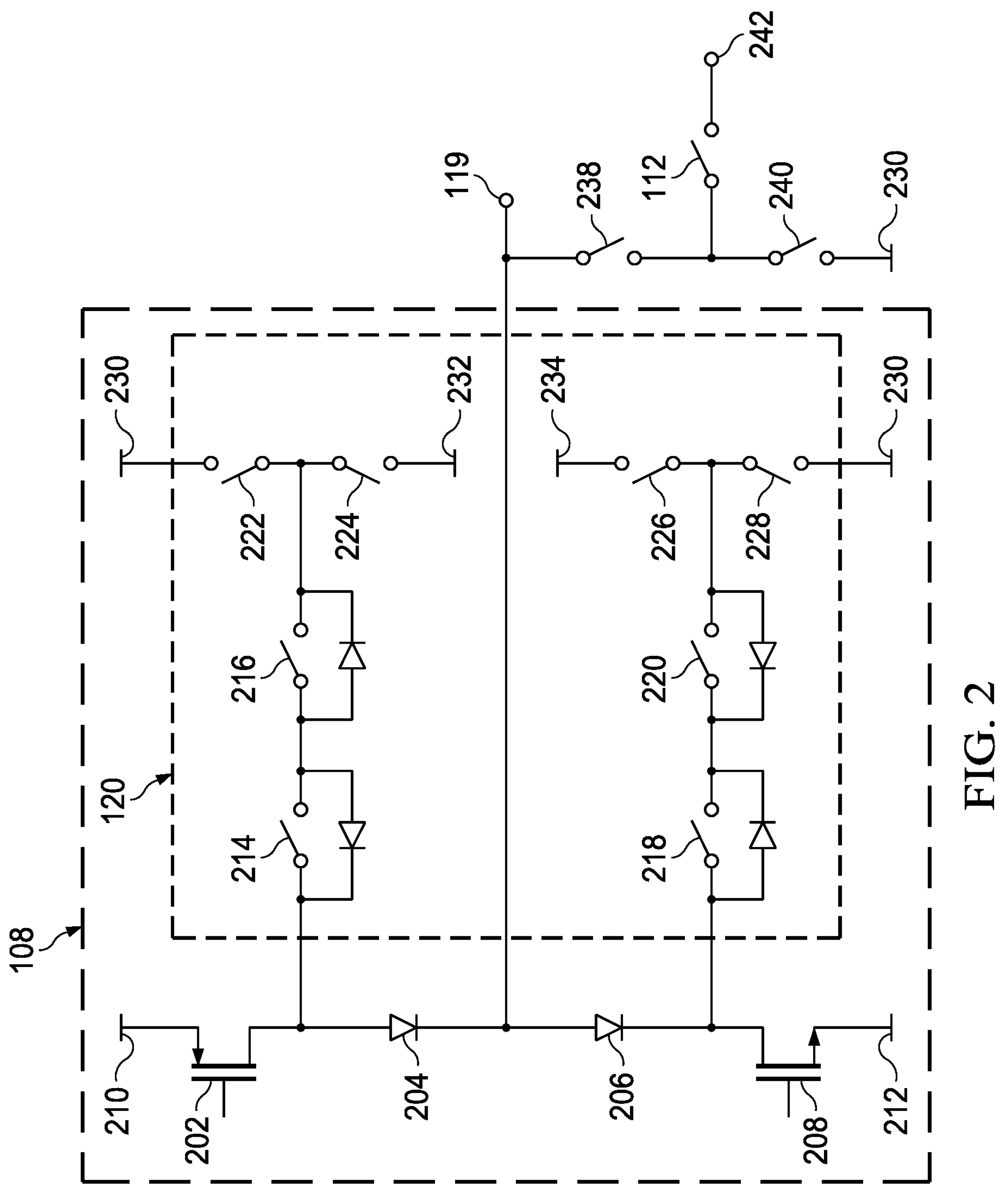
FIG. 2 is a schematic diagram showing an example second transmitter with pre-charge circuit.

FIG. 2 is a schematic diagram showing an example second transmitter 108 with pre-charging circuit 120. In an example, the second transmitter 108 also includes a switch 202, a diode 204, a diode 206, and a switch 208. In some examples, the node 119 is an input/output of the transmission circuit 104 and couples to the transducer 110, each of FIG. 1. In some examples, a switch 238 has a first terminal coupled to the node 119, and has a second terminal coupled to a first terminal of the transmit/receive switch 112, which has a second terminal coupled to a receiver circuit terminal 242. In some examples, a switch 240 has a first terminal coupled to the first terminal of the transmit/receive switch 112 and has a second terminal coupled to the ground terminal 230. In some examples, the receiver circuit terminal 242 couples to the receiver analog circuit 114 of FIG. 1. The switch 238, switch 240, and transmit/receive switch 112 may each be implemented according to any suitable process or technology, such as those described above with respect to other switches of this disclosure, the scope of which is not limited herein.

In some examples, the switch 202 and the switch 208 are each implemented as transistors. For example, the switch 202 may be implemented as a p-channel field effect transistor, and the switch 208 may be implemented as a n-channel field effect transistor. For example, the switch 202 may be implemented as a drain extended p-channel metal oxide semiconductor field effect transistor and the switch 208 may be implemented as a laterally diffused, or other, n-channel metal oxide semiconductor field effect transistor. When enabled, or turned on, the switch 202 and the switch 208 may be conductive. When disabled, or turned off, the switch 202 and the switch 208 may be substantially non-conductive, or in a high-impedance state to inhibit a flow of current through the respective switch. In some examples, the switch 202 and the switch 208 are high-voltage devices. As used herein, a high-voltage device may be a semiconductor device that has a safe operating range tolerance of greater than 5 volts (V) across its terminals (e.g., across its drain and source terminals (a drain-to-source voltage), or across its gate to drain terminals (a gate-to-drain voltage)), such as a tolerance of about 100 V, about 200 V, or greater. Similarly, a low-voltage device may be a semiconductor device that has a safe operating range tolerance of less than or equal to 5 V across its terminals.

In an example, the pre-charging circuit 120 includes a switch 214, a switch 216, a switch 218, a switch 220, a switch 222, a switch 224, a switch 226, and a switch 228 (collectively switches 214-228). The switches 214-228 may each be implemented according to any suitable process or technology, the scope of which is not limited herein. In some examples, the switches 214-228 are implemented as field effect transistors (FETs), such as metal oxide semiconductor FETs (MOSFETs). In some examples, the switches 214, 216, 218, 220 are high-voltage devices and the switches 222, 224, 226, 228 are low-voltage devices.

In an example architecture of the second transmitter 108, the switch 202 has a first terminal coupled to a first voltage supply terminal 210, has a second terminal, and has a control terminal. The first voltage supply terminal 210 receives a first supply voltage from a first voltage supply (not shown). In some example, the first supply voltage has a value in a range of about 2 V to about 100 V. The diode 204 has an anode coupled to the second terminal of the switch 202, and has a cathode coupled to the node 119. The diode 206 has an anode coupled to the node 119, and has a cathode. The switch 208 has a first terminal coupled to the cathode of the diode 206, a second terminal coupled to a second voltage supply terminal 212, and has a control terminal. The second voltage supply terminal 212 receives a second supply voltage from a second voltage supply (not shown). In some example, the second supply voltage has a value in a range of about −2 V to about −100 V. In an example, the controller 102 is coupled to the control terminals of the switches 202, 208.

In an example, the switch 214 has a first terminal coupled to the second terminal of the switch 202, and has a second terminal. The switch 216 has a first terminal coupled to the second terminal of the switch 214, and has a second terminal. The switch 218 has a first terminal coupled to the first terminal of the switch 208, and has a second terminal. The switch 220 has a first terminal coupled to the second terminal of the switch 218, and has a second terminal. The switch 222 has a first terminal coupled to a ground terminal 230, and has a second terminal coupled to the second terminal of the switch 216. The switch 224 has a first terminal coupled to the second terminal of the switch 216, and has a second terminal coupled to a third voltage supply terminal 232. The third voltage supply terminal 232 receives a third supply voltage from a third voltage supply (not shown). The switch 226 has a first terminal coupled to a fourth voltage supply terminal 234, and has a second terminal coupled to the second terminal of the switch 220. The fourth voltage supply terminal 234 receives a fourth supply voltage from a fourth voltage supply (not shown). The switch 228 has a first terminal coupled to the second terminal of the switch 220, and has a second terminal coupled to the ground terminal 230. In some examples, each of the switches 214-228 has a control terminal (not shown). In an example, the controller 102 is coupled to the control terminals of the switches 214-228. In some examples, a voltage provided at the first voltage supply terminal 210 is opposite in polarity to a voltage provide at the second voltage supply terminal 212. In some examples, a voltage provided at the ground terminal 230 has a value approximately equal to 0 V (e.g., a ground voltage potential). In some examples, the third supply voltage has a value within a safe operating range of the switch 224 and has a negative polarity. In some examples, the fourth supply voltage has a value within a safe operating range of the switch 226 and has a positive polarity.

In an example of operation of the second transmitter 108, while the second transmitter 108 is inactive (e.g., the first transmitter 106 is transmitting), the controller 102 provides control signals to control states of the switches 214-228. In some examples, the controller 102 provides the control signals to cause the second transmitter 108, and the switches 214-228, to be in one of multiple operational states, such as one of four possible operational states. For example, in a first operational state, such as a linear amplifier transmission state of operation, responsive to the second transmitter 108 being disabled, or the first transmitter 106 being enabled, the controller 102 provides control signals to the switches 216, 220, 222, 228, 238, and 240 to cause the switches to be turned off (e.g., be an open circuit). The controller 102 also provides control signals to the switches 224, 226 to cause the switches to be turned on (e.g., be a closed circuit or short). The controller 102 also provides control signals to the switches 214, 218 to cause the switches to be turned on for at least a first amount of time. In some examples, the first amount of time is until the first transmitter 106 is no longer transmitting. In other examples, the first amount of time is until the second terminal of the switch 202 has been charged to approximately a value of a voltage provided by the third voltage supply terminal 232, and the first terminal of the switch 208 has been charged to approximately a value of a voltage provided by the fourth voltage supply terminal 234.

In some examples, the switches 222-228 are low voltage devices, as described above. In some examples, controlling the switches as described above causes the second terminal of the switch 202 and the first terminal of the switch 208 to be biased to voltages approximately equal to those provided by the third voltage supply terminal 232 and the fourth voltage supply terminal 234, respectively. Such biasing may decrease capacitive loading, and thereby current draw, placed on the node 119 by the switch 202 and the switch 208, as well as reverse bias the diodes 204 and 206. For example, drain-to-bulk capacitance of the switch 202 and the switch 208 may be inversely proportional to the drain-to-source voltage of the switch 202 and the switch 208, respectively. By increasing the drain-to-source voltage through the biasing described herein, the drain-to-bulk capacitance is correspondingly decreased. In an example, the switches 214, 216 have bulk diodes and are arranged such that the anodes of the bulk diodes are coupled together (as shown in FIG. 2) or the cathodes of the bulk diodes are coupled together. Similarly, the switches 218, 220 have bulk diodes and are arranged such that the cathodes of the bulk diodes are coupled together (as shown in FIG. 2) or the anodes of the bulk diodes are coupled together. In an example, the bulk diodes of the switches 216, 220 function as blocking diodes, preventing a signal at the node 119 having a high voltage from damaging the switches 222-228, or loading from the switches 222-228 affecting a value of the signal at the node 119.

In a second operational state, such as a pulser transmission state of operation, while the second transmitter 108 is active (e.g., the first transmitter 106 is inactive), the controller 102 provides control signals to the second transmitter 108 to cause the second transmitter 108 to provide a pulse signal at the node 119 (e.g., such as via control of the switch 202 and the switch 208). For example, while the second transmitter 108 is providing the pulse signal, the controller 102 provides control signals to the switches 214-220 to cause the switches to be turned off. The controller 102 also provides control signals to the switches 222, 228 to cause the switches to be turned on, and controls signals to the switches 224, 226, 238, and 240 to cause the switches to be turned off.

In a third operational state, such as a clearing state of operation, the controller 102 provides control signals to the switches 214, 216, 222, 218, 220, 228, 238, and 240 to cause the switches to be turned on, and control signals to the switches 224 and 226 to cause the switches to be turned off. In the third operational state, the controller 102 controls the switches 214-220, 228, 238, and 240 to provide a switching arrangement that discharges or clears remaining charge in the second transmitter 108 and at the node 119. For example, during the third operational state, remaining charge at the switch 202, the switch 208, and/or the node 119 may be discharged to the ground terminal 230.

In a fourth operational state, such as a return to zero (RTZ) state of operation of the second transmitter 108, the controller 102 controls the switch 202 and the switch 208 to be turned off. The controller 102 also provides control signals to the switches 214-228. Responsive to the control signals having a first state during a first period of time, the switches 214-220, 222, and 228 close, and the switches 224, 226 open. Subsequently, responsive to the control signals having a second state during a second period of time, the switches 214-220, 224, and 226 close, and the switches 222, 228 open. In an example, the control signals during the RTZ state of operation implement a pre-charging state of the second transmitter 108 to create a switching arrangement in which current flows from the third voltage supply terminal 232 to decrease a time consumed by the diode 204 to perform reverse recovery. Also, current flows from the fourth voltage supply terminal 234 to decrease a time consumed by the diode 206 to perform reverse recovery. In this way, an amount of time between an end of the pulse signal (and a time at which the system 100 may be switched from a transmit mode, in which the transmit/receive switch 112 is open, to a receive mode. transmit/receive switch 112 is closed, without reverse recovery of the diodes 204, 206 adversely affecting a signal may be reduced. In some examples, the end of the pulse signal coincides with a beginning of the RTZ state of operation.

To enter the receive mode, the controller 102 provides a control signal to the transmit/receive switch 112. Responsive to the control signal, the transmit/receive switch 112 closes. The controller 102 also provides control signals to the switch 238 to cause the switch 238 to be turned on, and to the switch 240 to cause the switch 240 to be turned off. In some examples, responsive to the transmit/receive switch 112 being turned on, a signal provided at the node 119 is provided to the receiver circuit terminal 242, and correspondingly to the receiver analog circuit 114 for processing. In some examples, the second transmitter 108 is in a high-impedance state while the transmit/receive switch 112 is turned on, thereby preventing circuitry of the second transmitter 108 from adversely affecting the signal provided at the node 119 (e.g., such as a signal provided by the transducer 110). Prior to providing the control signal to the transmit/receive switch 112 to close the transmit/receive switch 112, the controller 102 provides control signals to the switches 214-228 to clear the second terminal of the switch 202 and the first terminal of the switch 208. For example, the controller 102 provides control signals to the switches 214-220 to cause the switches to be turned (or remain) on. The controller 102 also provides control signals to the switches 222, 228 to cause the switches to be turned on, thereby grounding and clearing remaining charge at the second terminal of the switch 202 and the first terminal of the switch 208, respectively. The controller 102 also provides control signals to the switches 224, 226 to cause the switches to be turned off.

Figure 3:
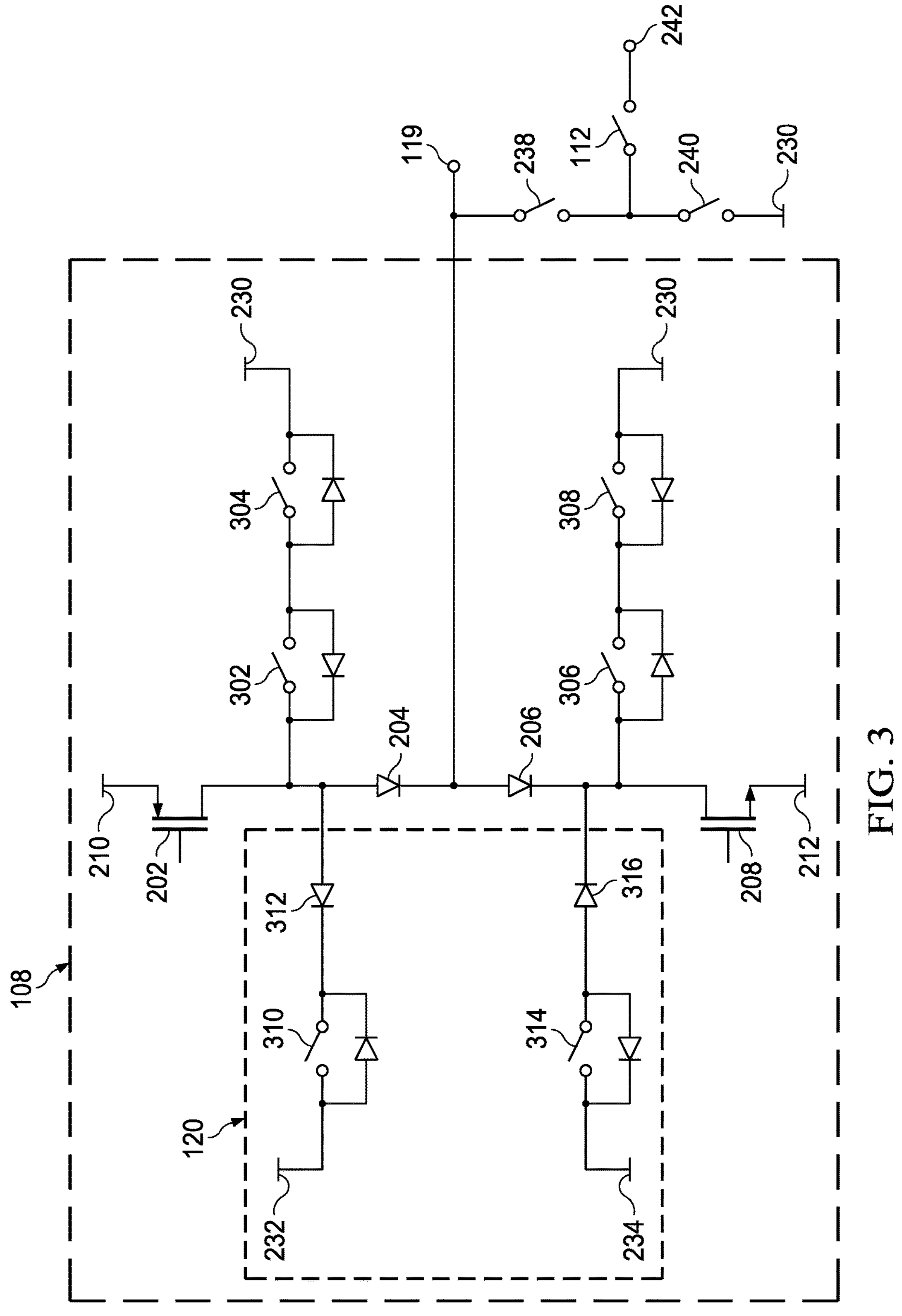
FIG. 3 is a schematic diagram showing an example second transmitter with pre-charge circuit.

FIG. 3 is a schematic diagram showing an example second transmitter 108 with pre-charging circuit 120. In an example, the circuitry includes the switches 112, 238, 240, and the second transmitter 108, including the switch 202, diode 204, diode 206, and switch 208, which may be coupled and operate substantially the same as described above with respect to FIG. 2. In an example, the second transmitter 108 also includes a switch 302, a switch 304, a switch 306, and a switch 308 (collectively switches 302-308). The switches 302-308 may each be implemented according to any suitable process or technology, the scope of which is not limited herein. In some examples, the switches 302-308 are implemented as FETs, such as MOSFETs. In some examples, the switches 302-308 are high-voltage devices, as described above. In an example, the pre-charging circuit 120 includes a switch 310, a diode 312, a switch 314, and a diode 316. The switches 310, 314 may cach be implemented according to any suitable process or technology, the scope of which is not limited herein. In some examples, the switches 310, 314 are implemented as FETs, such as MOSFETs. In some examples, the switches 310, 314 are high-voltage devices, as described above. In comparison to the pre-charging circuit 120 of FIG. 2, the pre-charging circuit 120 of FIG. 3 does not include low-voltage devices, making the second transmitter 108 of FIG. 3 suitable for use in an application environment that lacks voltage supply signals suitable for use with low-voltage devices.

In an example architecture of the second transmitter 108, the switch 302 has a first terminal coupled to the second terminal of the switch 202, and has a second terminal. The switch 304 has a first terminal coupled to the second terminal of the switch 302, and has a second terminal coupled to the ground terminal 230. The switch 306 has a first terminal coupled to the first terminal of the switch 208, and has a second terminal. The switch 308 has a first terminal coupled to the second terminal of the switch 306, and has a second terminal coupled to the ground terminal 230. The switch 310 has a first terminal coupled to the third voltage supply terminal 232, and has a second terminal. In the example of FIG. 3, the third supply voltage has a value within a safe operating range of the switch 310 and a polarity as described above with respect to FIG. 2. The diode 312 has an anode coupled to the second terminal of the switch 202, and has a cathode coupled to the second terminal of the switch 310. The switch 314 has a first terminal coupled to the fourth voltage supply terminal 234, and has a second terminal. In the example of FIG. 3, the fourth supply voltage has a value within a safe operating range of the switch 314 and a polarity as described above with respect to FIG. 2. The diode 316 has an anode coupled to the second terminal of the switch 314, and has a cathode coupled to the first terminal of the switch 208. In some examples, each of the switches 302-308, 310, and 314 has a control terminal (not shown). In an example, the controller 102 is coupled to the control terminals of the switches 302-308, 310, and 314.

In an example of operation of the second transmitter 108, while the second transmitter 108 is inactive (e.g., the first transmitter 106 is transmitting), the controller 102 provides control signals to control states of the switches 302-308, 310, and 314. For example, responsive to the second transmitter 108 being inactive, or the first transmitter 106 being active, the controller 102 provides control signals to the switches 302-308 to cause the switches to be turned off (e.g., be an open circuit). The controller 102 also provides control signals to the switches 310, 314 to cause the switches to be turned on (e.g., be a closed circuit or short). In some examples, controlling the switches as described above causes the second terminal of the switch 202 and the first terminal of the switch 208 to be biased to voltages approximately equal to those provided by the third voltage supply terminal 232 and the fourth voltage supply terminal 234, respectively. Such biasing may decrease capacitive loading, and thereby current draw, placed on the node 119 by the switch 202 and the switch 208, as described above. Also, the diodes 312, 316 function as blocking diodes, preventing loading by the switches 310, 314 of the node 119, which might adversely affect a value of a signal provided at the node 119

While the second transmitter 108 is active (e.g., the first transmitter 106 is inactive), the controller 102 provides control signals to the second transmitter 108 to cause the second transmitter 108 to provide a pulse signal at the node 119 (e.g., such as via control of the switch 202 and the switch 208). For example, while the second transmitter 108 is providing the pulse signal, the controller 102 provides control signals to the switches 302-308 to cause the switches to be turned off. The controller 102 also provides control signals to the switches 310, 314 to cause the switches to be turned off. During a RTZ state of operation of the second transmitter 108, the controller 102 controls the switches 302-308 to be turned off, and controls the switches 310, 314 to be turned on. In an example, the control signals during the RTZ state of operation of the second transmitter 108 create a switching arrangement in which current flows from the third voltage supply terminal 232 to decrease a time consumed by the diode 204 to perform reverse recovery, and current flows from the fourth voltage supply terminal 234 to decrease a time consumed by the diode 206 to perform reverse recovery. In this way, an amount of time between an end of the pulse signal (which may also coincide with a beginning of the RTZ state of operation) and a time at which the system 100 may be switched from a transmit mode to a receive mode without reverse recovery of the diodes 204, 206 adversely affecting a signal received responsive to reflected sound waves may be reduced.

To enter the receive mode following transmission by the first transmitter 106 or the second transmitter 108, the controller 102 provides a control signal to the transmit/receive switch 112 to cause the transmit/receive switch 112 to be turned on. In some examples, responsive to the transmit/receive switch 112 being turned on, a signal provided at the node 119 is provided to the receiver circuit terminal 242, and correspondingly to the receiver analog circuit 114 of FIG. 1 for processing. In some examples, the second transmitter 108 is in a high-impedance state while the transmit/receive switch 112 is turned on, thereby preventing circuitry of the second transmitter 108 from adversely affecting the signal provided at the node 119 (e.g., such as a signal provided by the transducer 110). Prior to providing the control signal to the transmit/receive switch 112 to close the transmit/receive switch 112, the controller 102 provides control signals to the switches 302-308, 310, 314 to clear the second terminal of the switch 202 and the first terminal of the switch 208. For example, the controller 102 provides control signals to the switches 302-308 to cause the switches to be turned on, thereby grounding and clearing remaining charge at the second terminal of the switch 202 and the first terminal of the switch 208, respectively. The controller 102 also provides control signals to the switches 310, 314 to cause the switches to be turned off.

As shown and described in this description, the second transmitter 108 is a three-level device. For example, the second transmitter 108 is capable of providing steady-state signals at the node 119 having one of three voltage levels (e.g., a voltage provided by the first voltage supply terminal 210, a voltage provide by the second voltage supply terminal 212, or a voltage as provided at the ground terminal 230). In some examples, the second transmitter 108 may instead be implemented as a five-level device, a seven-level device, and so on to provide steady-state signals having a greater number of possible voltages. For example, a five-level implementation of the second transmitter 108 is implemented by coupling two instances of the second transmitter 108, as described herein, in parallel to the node 119. In such examples, values of voltages provided by the first voltage supply terminal 210 and the second voltage supply terminal 212 may vary from the first instance of the second transmitter 108 to the second instance of the second transmitter 108. Also in such examples, states of switches described herein may be modified to account for the increased levels of the second transmitter 108.

Figure 4:
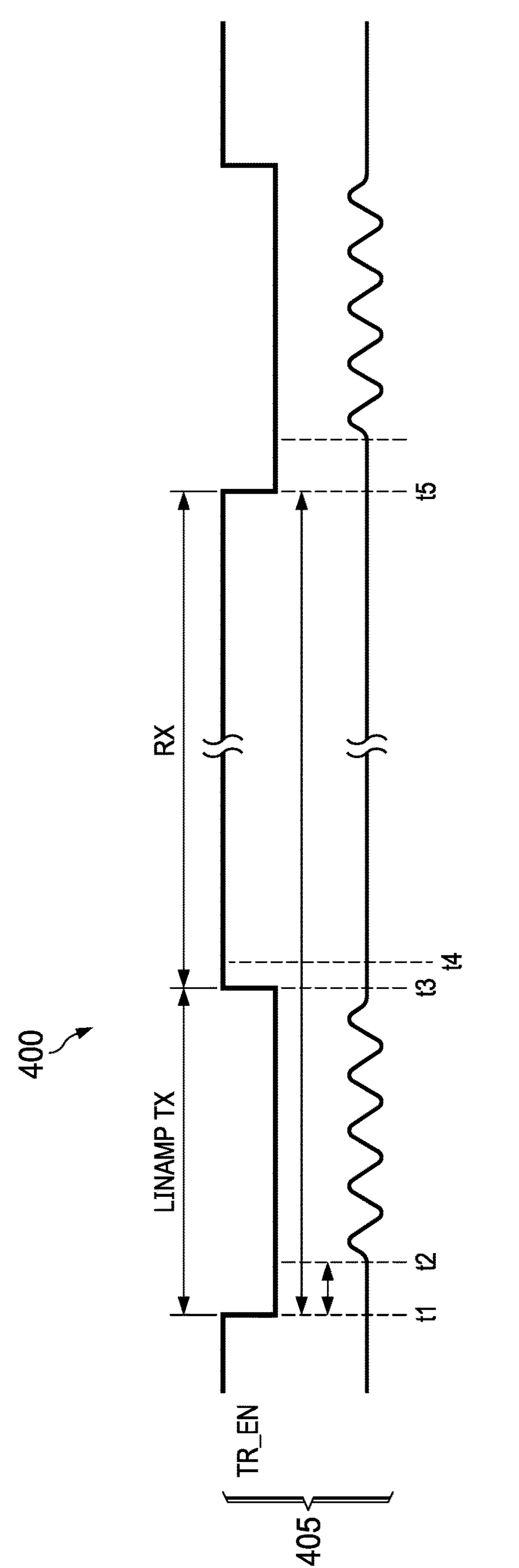
FIG. 4 is an example signal diagram showing states of operation of a transmission circuit.
Figure 4:
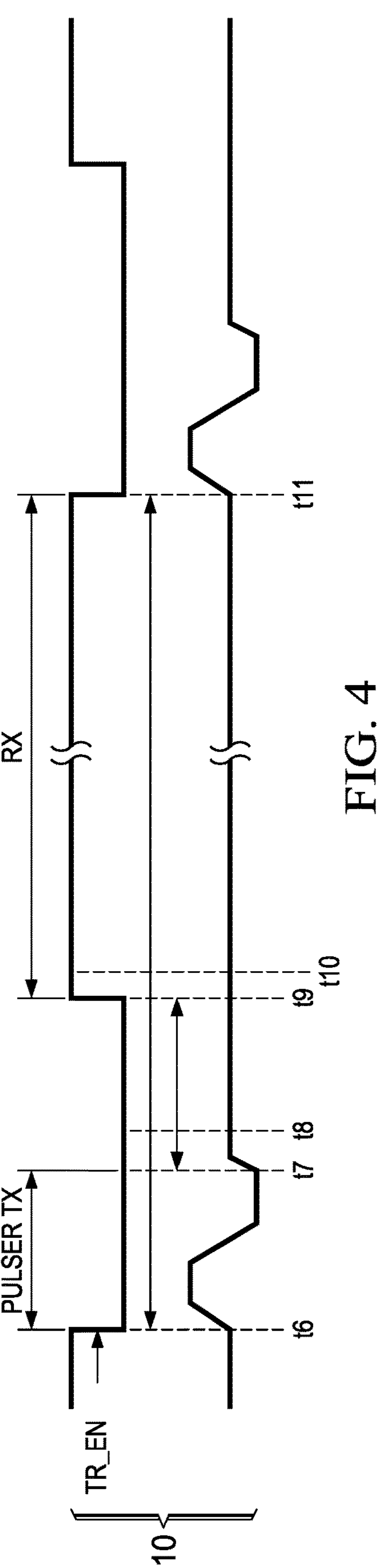

FIG. 4 is an example signal diagram 400 showing states of operation of the transmission circuit 104. The signal diagram 400 includes waveforms 405 representative of operation in a linear amplifier mode (e.g., transmission by the first transmitter 106), and waveforms 410 representative of operation in a pulser mode (e.g., transmission by the second transmitter 108).

As shown by the waveforms 405, at a time t1, the first transmitter 106 is enabled. For example, responsive to receipt of a control signal from the controller 102, the first transmitter 106 exits the high impedance state and begins providing a signal at the node 119. Also at time t1, a pre-charge period begins in which the controller 102 controls the second transmitter 108, as described above with respect to FIGS. 2 and 3, to bias the second terminal of the switch 202 and the first terminal of the switch 208 to voltages approximately equal to those provided by the third voltage supply terminal 232 and the fourth voltage supply terminal 234, respectively. At time t2, the first transmitter 106 begins transmitting, and continues until time t3. At time t3, a receive mode of the system 100 begins. At a start of the receive mode (e.g., at time t3), a clearing period begins in which the controller 102 controls the second transmitter 108, as described above with respect to FIGS. 2 and 3, to ground the second terminal of the switch 202 and the first terminal of the switch 208, clearing remaining charge at the second terminal of the switch 202 and the first terminal of the switch 208. Subsequent to the clearing period, at time t4, the system 100 enters a receive mode in which a signal may be received until time t5. In some examples, a period of time from t1 to t3 corresponds to the first operational state, as described above. In some examples, the clearing period from t3 to t4 corresponds to the third operational state, as described above.

As shown by the waveforms 410, at a time t6, the second transmitter 108 is enabled and the second transmitter 108 transmits a pulse signal, as described above, until time t7. For example, responsive to receipt of a control signal from the controller 102, the second transmitter 108 exits the high impedance state and begins providing a signal at the node 119. In some examples, a period of time from t6 to t7 corresponds to the second operational state, as described above. At time t7, the second transmitter 108 performs a clearing operation, such as described above with respect to the third operational state. At time t8, the second transmitter 108 enters a RTZ state of operation, as described above. During the RTZ state of operation (e.g., beginning at time t8 and continuing until time t9), the controller 102 controls the second transmitter 108, as described above with respect to FIGS. 2 and 3, to bias the second terminal of the switch 202 and the first terminal of the switch 208 to voltages approximately equal to those provided by the third voltage supply terminal 232 and the fourth voltage supply terminal 234, respectively. In some examples, a period of time from t8 to t9 corresponds to the fourth operational state, as described above. At time t9, a receive mode of the system 100 begins. At a start of the receive mode (e.g., at time t9), a clearing period begins in which the controller 102 controls the second transmitter 108, as described above with respect to FIGS. 2 and 3, to ground the second terminal of the switch 202 and the first terminal of the switch 208, clearing remaining charge at the second terminal of the switch 202 and the first terminal of the switch 208. In some examples, a period of time from t9 to t10 corresponds to the fourth operational state, as described above. Subsequent to the clearing period, at time t10, the system 100 enters a receive mode in which a signal may be received until time t11.

Figure 5:
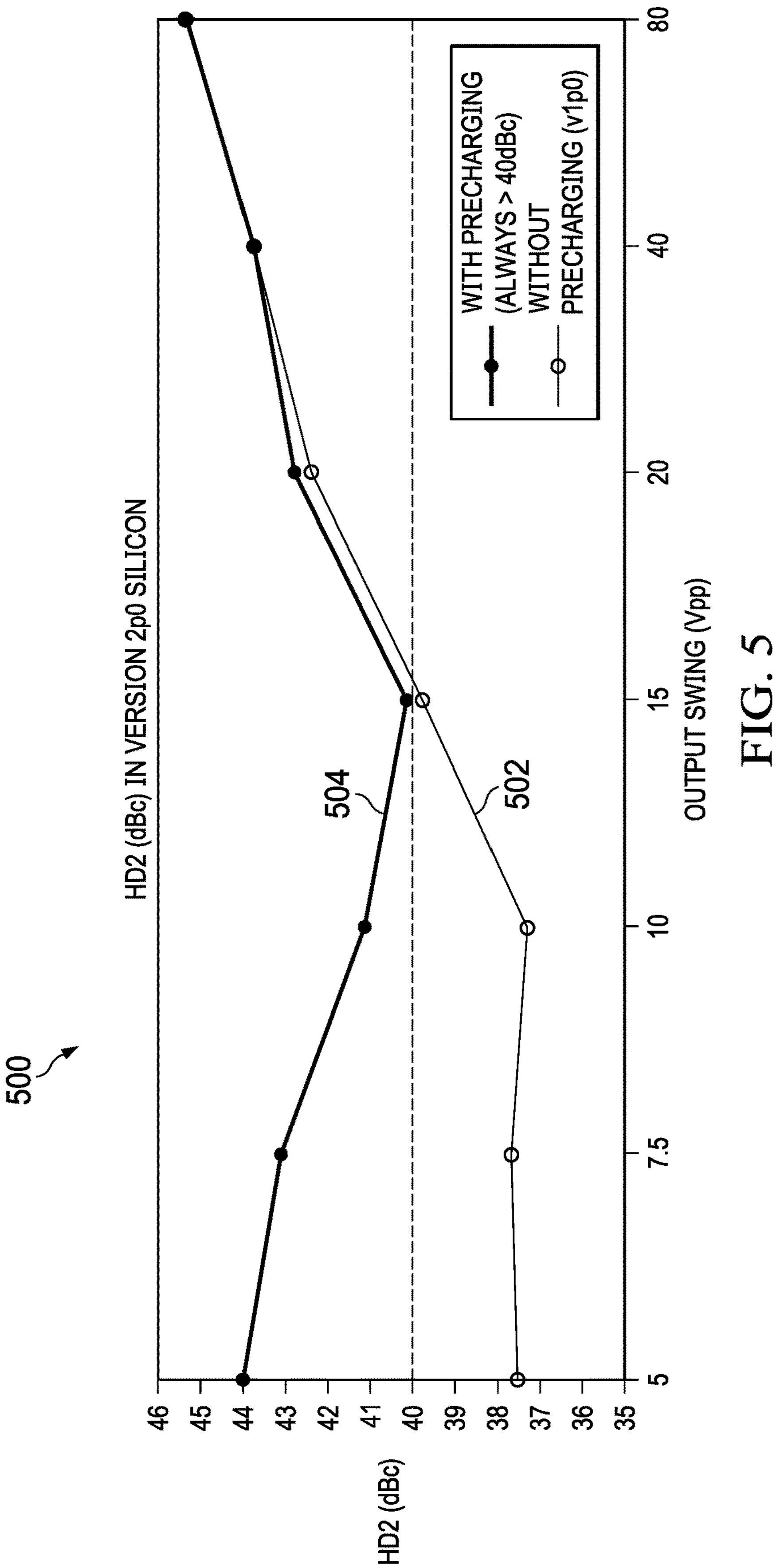
FIG. 5 is an example graph showing a performance comparison with and without pre-charging.

FIG. 5 is an example graph 500 showing a performance comparison with and without pre-charging. For example, the graph 500 includes a signal 502 representative of performance in a system in the absence of the pre-charging of this description, and a signal 504 representative of performance in the system 100 having the pre-charging of this description. The graph 500 is shown having a vertical axis representative of second harmonic performance (HD2) in units of decibels (dB), and a horizontal axis representative of a peak-to-peak voltage swing, in units of volts, of an output signal.

In the graph 500, HD2 is determined or obtained by taking the difference, in a logarithmic domain, between fundamental power of the signal and the second harmonic power in the signal. In various use cases, it may be useful to maintain HD2 having a value greater than a threshold, shown in FIG. 5 to be 40 dB. For example, for certain application environments, such as tissue harmonic imaging (e.g., in an ultrasound imaging system), a signal is transmitted at a fundamental frequency and a reflected signal is formed through the non-linearity of human tissue. That non-linearity causes the reflected signal to include second harmonic components of the fundamental frequency, and in some examples, it is this second harmonic information that is useful in discerning information about the human tissue. In such examples, an HD2 value less than about 40 dB may decrease performance of the imaging system by resulting in poor imaging performance and/or masking information included in the reflected signal related to the human tissue. As shown by the signal 504, the pre-charging of this description maintains HD2 having a value greater than or equal to the signal 502, and remaining above the performance threshold of 40 dB, unlike the signal 502. As such, performance of the system 100 is improved via the pre-charging of this description in comparison to similar systems lacking such pre-charging.

Figure 6A:
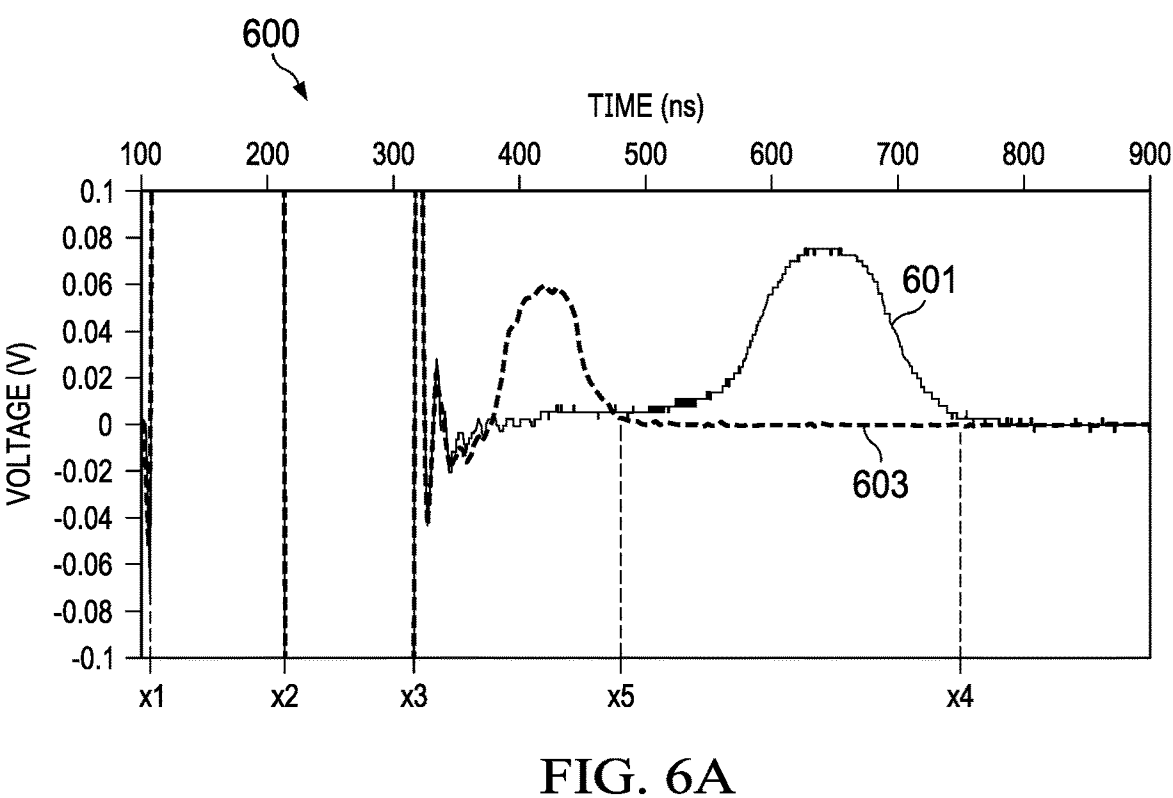
FIG. 6A is an example signal diagram showing time domain waveforms with and without pre-charging.
Figure 6B:
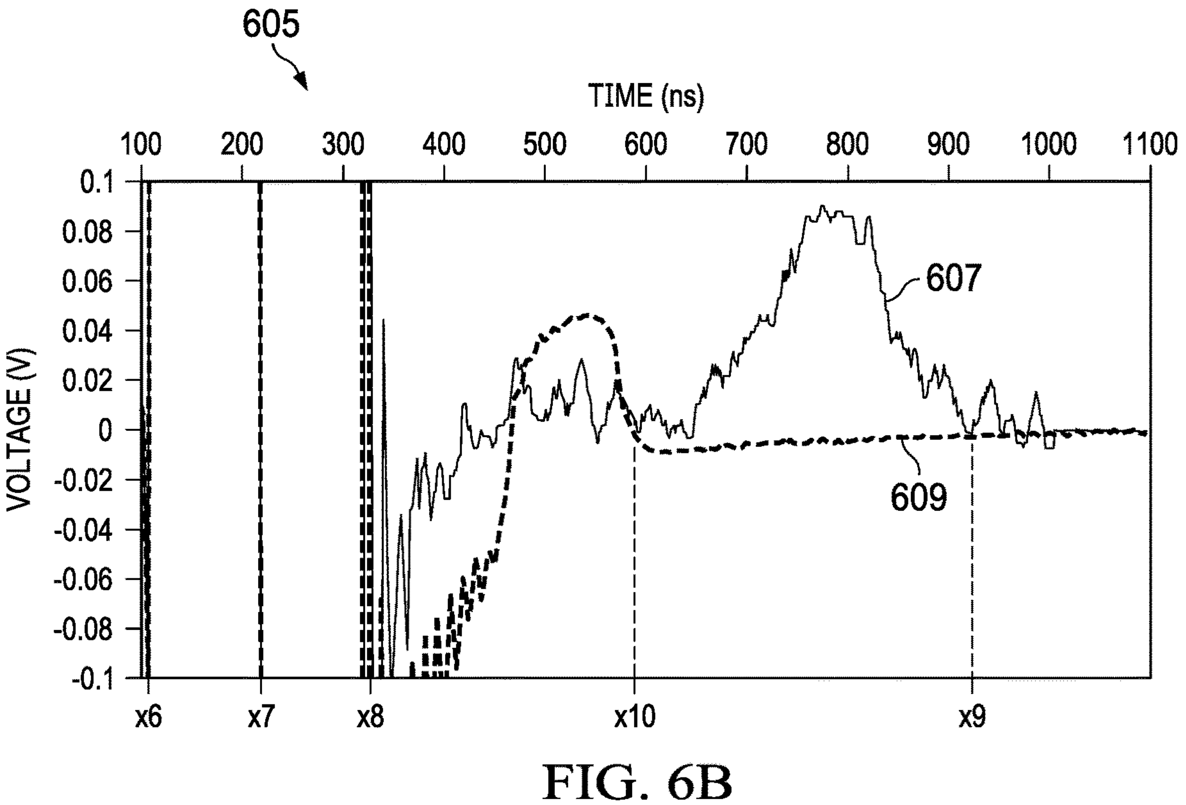
FIG. 6B is an example signal diagram showing time domain waveforms with and without pre-charging.

FIGS. 6A and 6B are example signal diagrams 600 and 605 showing time domain waveforms with and without pre-charging. In an example, the signal diagram 600 corresponds to an application environment in which the first voltage supply terminal 210 provides a signal having a voltage of about +5 V and the second voltage supply terminal 212 provides a signal having a voltage of about −5 V. In an example, the signal diagram 605 corresponds to an application environment in which the first voltage supply terminal 210 provides a signal having a voltage of about +80 V and the second voltage supply terminal 212 provides a signal having a voltage of about −80 V. The diagrams 600 and 605 each have a vertical axis representative of voltage in units of V, and a horizontal axis representative of time in units of nanoseconds (ns).

The diagram 600 includes signals 601 and 603. Signal 601 is representative of a value of a signal provided at the node 119 in an example of the system 100 which does not include pre-charging, as described herein. Signal 603 is representative of a value of a signal provided at the node 119 in an example of the system 100 which includes pre-charging, as described herein. As shown by the diagram 600, the second transmitter 108 provides pulse signals at times x1, x2, and x3. Following the pulse at x3, a final pulse of a pulse train transmitted by the second transmitter 108, reverse recovery occurs in the second transmitter 108, between x3 and time x4 as shown by the signal 601, and between x3 and time x5 as shown by the signal 603. In an example, x4-x3 is approximately equal to 440 ns and x5-x3 is less than approximately 200 ns. As such, the diagram 600 demonstrates that a duration of time consumed for reverse recovery of components of the second transmitter 108, and therefore an amount of time between an end of a transmit mode of the system 100 and a beginning of a receive mode of the system 100, is reduced through implementation of the pre-charging of this description.

Similarly, the diagram 605 includes signals 607 and 609. Signal 607 is representative of a value of a signal provided at the node 119 in an example of the system 100 which does not include pre-charging, as described herein. Signal 609 is representative of a value of a signal provided at the node 119 in an example of the system 100 which includes pre-charging, as described herein. As shown by the diagram 600, the second transmitter 108 provides pulse signals at times x6, x7, and x8. Following the pulse at x8, a final pulse of a pulse train transmitted by the second transmitter 108, reverse recovery occurs in the second transmitter 108, between x8 and time x9 as shown by the signal 607, and between x8 and time x10 as shown by the signal 609. In an example, x9-x8 is greater than approximately 550 ns and x10-x8 is less than approximately 300 ns. As such, the diagram 605 demonstrates that a duration of time consumed for reverse recovery of components of the second transmitter 108, and therefore an amount of time between an end of a transmit mode of the system 100 and a beginning of a receive mode of the system 100, is reduced through implementation of the pre-charging of this description.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. A bulk diode, as described herein, is an inherently existing diode existing between a source and drain of a semiconductor device.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device, or a semiconductor component. Furthermore, a voltage rail or more simply a "rail," may also be referred to as a voltage terminal and may generally mean a common node or set of coupled nodes in a circuit at the same potential.

What is claimed is:

1. A circuit, comprising:

a first transistor having a control terminal and first and second terminals;

a first diode having an anode and a cathode, the anode of the first diode coupled to the second terminal of the first transistor;

a second diode having an anode and a cathode, the anode of the second diode coupled to the cathode of the first diode;

a second transistor having a control terminal and first and second terminals, the first terminal of the second transistor coupled to the cathode of the second diode;

a third diode having an anode and a cathode, the anode of the third diode coupled to the second terminal of the first transistor;

a first switch having first and second terminals, the first terminal of the first switch coupled to the cathode of the third diode;

a fourth diode having an anode and a cathode, the cathode of the fourth diode coupled to the first terminal of the second transistor;

a second switch having first and second terminals, the first terminal of the second switch coupled to the anode of the fourth diode;

a third switch having first and second terminals, the first terminal of the third switch coupled to the second terminal of the first transistor;

a fourth switch having first and second terminals, the first terminal of the fourth switch coupled to the second terminal of the third switch, and the second terminal of the fourth switch coupled to a ground terminal;

a fifth switch having first and second terminals, the first terminal of the fifth switch coupled to the first terminal of the second transistor; and a sixth switch having first and second terminals, the first terminal of the sixth switch coupled to the second terminal of the fifth switch, and the second terminal of the sixth switch coupled to the ground terminal, wherein the circuit is configured to receive control signals and, in response to the control signals:

in a first operational state, open the first through sixth switches responsive to the first or second transistors being conductive;

in a second operational state, close the third through sixth switches and open the first and second switches, while the first and second transistors are non-conductive; and in a third operational state, close first and second switches and open the third through sixth switches, while the first and second transistors are non-conductive.

2. The circuit of claim 1, wherein the first terminal of the first transistor is coupled to a first voltage supply terminal, the second terminal of the second transistor is coupled to a second voltage supply terminal, and the circuit is configured to receive a first voltage at the first voltage supply terminal and a second voltage at the second voltage supply terminal, the first voltage opposite in polarity to the second voltage supply terminal.

3. The circuit of claim 2, wherein the second terminal of the first switch is coupled to a third voltage supply terminal, the second terminal of the second switch is coupled to a fourth voltage supply terminal, and the circuit is configured to receive a third voltage at the third voltage supply terminal and a fourth voltage at the fourth voltage supply terminal, the third voltage opposite in polarity to the first voltage, and the fourth voltage is opposite in polarity to the second voltage supply terminal.

4. The circuit of claim 1, further comprising a linear amplifier having an output coupled to the cathode of the first diode.

5. The circuit of claim 1, further comprising a receiver circuit having an input coupled to the cathode of the first diode.

6. The circuit of claim 5, further comprising a seventh switch coupled between the input of the receiver circuit and the cathode of the first diode.

7. The circuit of claim 1, further comprising a transducer coupled to the cathode of the first diode.

8. A circuit, comprising:

a first transistor having a control terminal and first and second terminals;

a first diode having an anode and a cathode, the anode of the first diode coupled to the second terminal of the first transistor;

a second diode having an anode and a cathode, the anode of the second diode coupled to the cathode of the first diode;

a second transistor having a control terminal and first and second terminals, the first terminal of the second transistor coupled to the cathode of the second diode;

a first switch having first and second terminals, the first terminal of the first switch coupled to the second terminal of the first transistor;

a second switch having first and second terminals, the first terminal of the second switch coupled to the second terminal of the first switch;

a third switch having first and second terminals, the first terminal of the third switch coupled to a ground terminal, and the second terminal of the third switch coupled to the second terminal of the second switch; and a fourth switch having first and second terminals, the first terminal of the fourth switch coupled to the second terminal of the second switch.

9. The circuit of claim 8, further comprising:

a fifth switch having first and second terminals, the first terminal of the fifth switch coupled to the first terminal of the second transistor;

a sixth switch having first and second terminals, the first terminal of the sixth switch coupled to the second terminal of the fifth switch;

a seventh switch having first and second terminals, and the second terminal of the seventh switch coupled to the second terminal of the sixth switch; and an eighth switch having first and second terminals, the first terminal of the eighth switch coupled to the second terminal of the sixth switch, and the second terminal of the eighth switch coupled to the ground terminal.

10. The circuit of claim 9, wherein the first switch and the second switch are each implemented as transistors having bulk diodes, each having an anode and a cathode, and wherein the first switch and the second switch are arranged such that the anodes of the bulk diodes are coupled together or the cathodes of the bulk diodes are coupled together.

11. The circuit of claim 9, wherein the first, second, fifth, and sixth switches have a higher voltage tolerance than the third, fourth, seventh, and eighth switches.

12. The circuit of claim 9, wherein the circuit is configured to receive control signals and, in response to the control signals:

in a first operational state, close the first, fourth, fifth, and seventh switches, and open the second, third, sixth, and eighth switches, while the first and second transistors are non-conductive;

in a second operational state, open the first through eighth switches while the first or second transistors are conductive;

in a third operational state, close the first through third, fifth, sixth, and eighth switches and open the fourth and seventh switches, while the first and second transistors are non-conductive; and in a fourth operational state, close the first, second, and fourth through seventh switches and open the third and eighth switches, while the first and second transistors are non-conductive.

13. The circuit of claim 12, wherein the first operational state is a linear amplifier transmission state, the second operational state is a pulser transmission state, the third operational state is a clearing state, and the fourth operational state is a pre-charging state.

14. The circuit of claim 13, wherein a receive mode of the circuit begins with the third operational state, following the fourth operational state ending a transmit mode of the circuit.

15. The circuit of claim 8, further comprising a linear amplifier having an output coupled to the cathode of the first diode.

16. The circuit of claim 8, further comprising a receiver circuit having an input coupled to the cathode of the first diode.

17. The circuit of claim 16, further comprising a fifth switch coupled between the input of the receiver circuit and the cathode of the first diode.

18. The circuit of claim 8, further comprising a transducer coupled to the cathode of the first diode.

* * * * *